United States Patent
Terada

(10) Patent No.: US 10,040,204 B2
(45) Date of Patent: Aug. 7, 2018

(54) PLATE-SHAPED WORKPIECE TRANSFER APPARATUS AND PROCESSING APPARATUS

(71) Applicant: DISCO CORPORATION, Tokyo (JP)

(72) Inventor: Kazuki Terada, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 15/676,585

(22) Filed: Aug. 14, 2017

(65) Prior Publication Data
US 2018/0056525 A1    Mar. 1, 2018

(30) Foreign Application Priority Data

Aug. 24, 2016 (JP) .................. 2016-164029

(51) Int. Cl.
| | | |
|---|---|---|
| *B25J 15/06* | (2006.01) | |
| *B25J 15/00* | (2006.01) | |
| *H01L 21/67* | (2006.01) | |
| *H01L 21/683* | (2006.01) | |
| *H01L 21/687* | (2006.01) | |

(52) U.S. Cl.
CPC ....... *B25J 15/0616* (2013.01); *B25J 15/0014* (2013.01); *H01L 21/67092* (2013.01); *H01L 21/6838* (2013.01); *H01L 21/68721* (2013.01)

(58) Field of Classification Search
CPC .... B25J 15/0014; B25J 15/0616; B25J 15/08; B25J 15/10; B25J 15/103; B25J 15/106; H01L 21/304; H01L 21/68721; H01L 21/68728; H01L 21/68735
See application file for complete search history.

(56) References Cited

U.S. PATENT DOCUMENTS 9,821,469 B2 *  11/2017  Hara .................... B25J 15/0616

FOREIGN PATENT DOCUMENTS

| JP | 2007-258450 | | 4/2007 |
|---|---|---|---|
| JP | 2007258450 A | * | 10/2007 |
| JP | 2012-064872 | | 3/2012 |
| JP | 2012064872 A | * | 3/2012 |
| JP | 2012099755 A | * | 5/2012 |
| JP | 2015072971 A | * | 4/2015 |
| JP | 2015082570 A | * | 4/2015 |

* cited by examiner

*Primary Examiner* — Gerald McClain
(74) *Attorney, Agent, or Firm* — Greer Burns & Crain Ltd.

(57) ABSTRACT

Apparatus transfers a plate-shaped workpiece to/from a holding surface of a chuck table. The apparatus includes a holding unit and a moving mechanism. The holding unit includes at least two holding members for holding the outer edge of the workpiece, a support plate for supporting the holding members so as to allow movement of the holding members toward or away from the outer edge of the workpiece, and a moving unit for moving the holding members. Each holding member includes a rod portion vertically movably extending downward through the support plate, an engaging portion formed on the outer circumference of the rod portion at the lower end thereof for engaging the outer edge of the workpiece, and a nozzle portion for discharging a fluid from the lower surface of the rod portion toward the holding surface to thereby float the workpiece from the holding surface.

3 Claims, 18 Drawing Sheets

PRIOR ART  PRIOR ART

PLATE-SHAPED WORKPIECE TRANSFER APPARATUS AND PROCESSING APPARATUS

BACKGROUND OF THE INVENTION

Field of the Invention

The present invention relates to a plate-shaped workpiece transfer apparatus and a processing apparatus.

Description of the Related Art

Conventionally known is a processing apparatus for processing a plate-shaped workpiece such as a semiconductor wafer, packaged substrate, and glass substrate. For example, such a plate-shaped workpiece is thinned or divided into individual device chips by the processing apparatus. In general, the plate-shaped workpiece is transferred in the condition where it is held under suction by a vacuum pad or the like in the processing apparatus. However, there is a case that the adhesion of foreign matter to the front side of the plate-shaped workpiece is undesirable, that any unevenness is present on the front side of the plate-shaped workpiece, or that a circular recess is formed on the back side of the plate-shaped workpiece and an annular projection is accordingly formed so as to surround the circular recess as in a so-called "TAIKO" wafer, so that the plate-shaped workpiece is very thin and brittle in a central portion other than the peripheral portion thereof. To cope with such a case, there has been proposed a transfer mechanism (edge clamp) for transferring a plate-shaped workpiece by engaging the outer edge of the plate-shaped workpiece (see Japanese Patent Laid-open No. 2007-258450).

However, in the transfer mechanism described in Japanese Patent Laid-open No. 2007-258450, at least a part of the outer edge of the plate-shaped workpiece must be projected from a holding surface of a chuck table so that the back side of the outer edge of the plate-shaped workpiece can be held by a holding portion of the transfer mechanism. Accordingly, the chuck table is required to have a special shape (see Japanese Patent Laid-open No. 2012-064872) or the transfer mechanism must be adjusted so as to prevent a possibility that the holding portion for engaging the outer edge of the plate-shaped workpiece may collide with the holding surface of the chuck table to cause damage to the chuck table.

SUMMARY OF THE INVENTION

However, in the transfer mechanism described in Japanese Patent Laid-open No. 2007-258450 or 2012-064872, there is a problem such that the number of man-hours required for adjustment of the position of each part of the mechanism is increased to prevent the above possibility that the holding portion for engaging the outer edge of the plate-shaped workpiece may collide with the holding surface of the chuck table to cause damage to the chuck table.

It is therefore an object of the present invention to provide a plate-shaped workpiece transfer apparatus and a processing apparatus which can suppress possible damage to the apparatus without the need for increasing the number of man-hours required for adjustment of the position of each part of the apparatus.

In accordance with an aspect of the present invention, there is provided a plate-shaped workpiece transfer apparatus for transferring a plate-shaped workpiece to/from a holding surface of a chuck table, the plate-shaped workpiece transfer apparatus including a holding unit for holding the plate-shaped workpiece; and a moving mechanism for moving the holding unit; the holding unit including at least two holding members for holding the outer edge of the plate-shaped workpiece, a support plate for supporting the holding members so as to allow the movement of the holding members in a moving direction toward or away from the outer edge of the plate-shaped workpiece, and a moving unit for moving the holding members in the moving direction; each of the holding members including a rod portion vertically movably extending downward through the support plate, an engaging portion formed on the outer circumference of the rod portion at the lower end thereof for engaging the outer edge of the plate-shaped workpiece, and a nozzle portion for discharging a fluid from the lower surface of the rod portion toward the holding surface to thereby float the plate-shaped workpiece from the holding surface.

Preferably, the rod portion is loosely inserted through a hole formed in the support plate so as to be tiltable; whereby when the fluid is discharged from the nozzle portion, the tilt of the rod portion is adjusted so that the lower surface of the rod portion becomes parallel to the holding surface.

Preferably, the plate-shaped workpiece transfer apparatus further includes a plurality of restriction pins for restricting the movement of the plate-shaped workpiece in a direction parallel to the holding surface; the restriction pins being vertically movably supported to the support plate so as to project downward from the support plate; the restriction pins being arranged around the plate-shaped workpiece in the condition where the plate-shaped workpiece is held by the holding members; the lower surface of each restriction pin being formed with a restriction pin nozzle for discharging a fluid toward the holding surface to thereby position the lower surface of each restriction pin in the vicinity of the holding surface.

In accordance with another aspect of the present invention, there is provided a processing apparatus including a chuck table having a holding surface for holding a plate-shaped workpiece; a processing unit for processing the plate-shaped workpiece held on the holding surface of the chuck table; and a transfer unit for transferring the plate-shaped workpiece to/from the holding surface of the chuck table; wherein the transfer unit is provided by the above-mentioned plate-shaped workpiece transfer apparatus.

According to the plate-shaped workpiece transfer apparatus and the processing apparatus of the present invention, possible damage to the apparatus can be suppressed without the need for increasing the number of man-hours required for adjustment of the position of each part.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

First Preferred Embodiment

Figure 1:
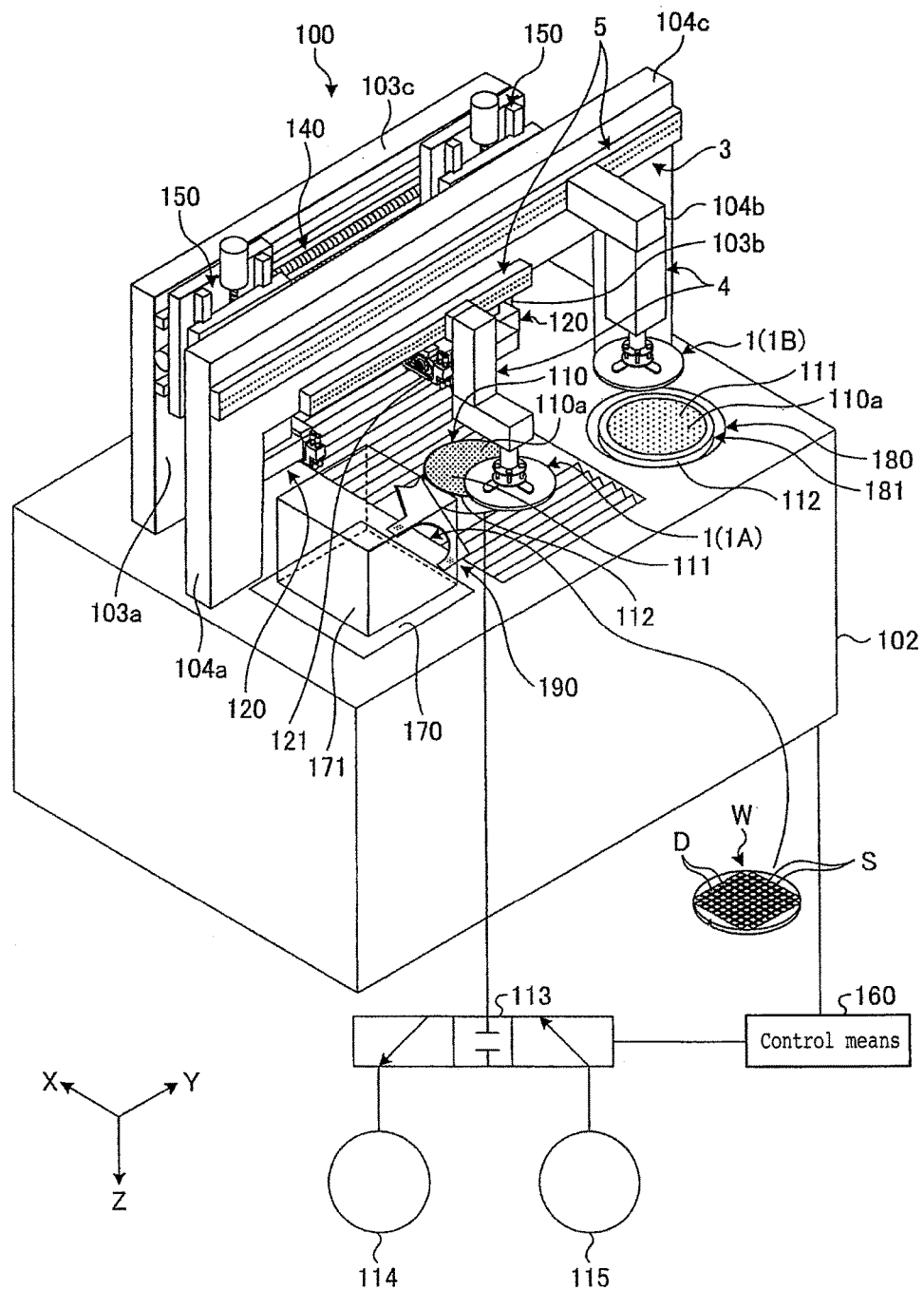
FIG. 1 is a perspective view depicting the configuration of a cutting apparatus as a processing apparatus including a plate-shaped workpiece transfer apparatus according to a first preferred embodiment.

A plate-shaped workpiece transfer apparatus and a processing apparatus according to a first preferred embodiment of the present invention will now be described with reference to the drawings. Referring to FIG. 1, there is depicted a cutting apparatus 100 as a processing apparatus including a plate-shaped workpiece transfer apparatus 1 according to the first preferred embodiment. The cutting apparatus 100 is an apparatus for cutting (processing) a plate-shaped workpiece W.

In the first preferred embodiment, the workpiece W is a disk-shaped semiconductor wafer or optical device wafer formed of silicon, sapphire, gallium arsenide, for example, as a base material. The workpiece W has a front side on which a plurality of devices D are formed so as to be separated from each other by a plurality of crossing streets S. While the workpiece W in the first preferred embodiment is a semiconductor wafer or optical device wafer having a uniform thickness, the workpiece in the present invention may also include a so-called TAIKO wafer composed of a thin central portion and a thick peripheral portion. Further, the workpiece in the present invention may include any plate-shaped members other than a wafer, such as a rectangular packaged substrate, ceramic plate, or glass plate having a plurality of devices sealed with resin.

The cutting apparatus 100 depicted in FIG. 1 is a processing apparatus for cutting (processing) the workpiece W to divide it into the individual devices D (device chips). As depicted in FIG. 1, the cutting apparatus 100 includes a chuck table 110 having a holding surface 110a for holding the workpiece W under suction, cutting means 120 as a processing unit for cutting the workpiece W held on the chuck table 110, and the plate-shaped workpiece transfer apparatus 1 as a transfer unit.

The cutting apparatus 100 depicted in FIG. 1 further includes X moving means (not depicted) for feeding the chuck table 110 in the X direction parallel to a horizontal direction and the transverse direction of a rectangular base housing 102, Y moving means 140 for indexing the cutting means 120 in the Y direction parallel to a horizontal direction and the longitudinal direction of the base housing 102 and perpendicular to the X direction, Z moving means 150 for moving the cutting means 120 in the Z direction parallel to a vertical direction and perpendicular to both the X direction and the Y direction, and control means 160. As depicted in FIG. 1, the cutting apparatus 100 is a two-spindle type dicing saw, or so-called facing dual type cutting apparatus including two cutting means 120.

The chuck table 110 is a disk-shaped member including a circular holding portion 111 having the holding surface 110a for holding the workpiece W and a ringlike frame portion 112 surrounding the holding portion 111. The holding portion 111 is formed of porous ceramic, and the frame portion 112 is formed of conductive metal. The chuck table 110 is movable by the X moving means and rotatable by a rotational drive source (not depicted). The chuck table 110 is connected through a selector valve 113 to a vacuum source 114 or a gas source 115. When the chuck table 110 is connected through the selector valve 113 to the vacuum source 114, a suction force produced by the vacuum source 114 is applied to the chuck table 110 to thereby hold the workpiece W on the chuck table 110 under suction. When the chuck table 110 is connected through the selector valve 113 to the gas source 115, a pressurized gas is supplied from the gas source 115 to the chuck table 110 to thereby cancel the suction holding of the workpiece W.

Each cutting means 120 includes a spindle (not depicted) on which a cutting blade 121 is mounted to cut the workpiece W held on the chuck table 110. Each cutting means 120 is movable in the Y direction by operating the Y moving means 140 and also movable in the Z direction by operating the Z moving means 150, relative to the workpiece W held on the chuck table 10.

As depicted in FIG. 1, the two cutting means 120 are supported to a double column type support structure composed of two columns 103a and 103b provided on the upper surface of the base housing 102 and a horizontal bar 103c connecting the upper ends of the two columns 103a and 103b. One of the two cutting means 120 is supported through the Y moving means 140 and the Z moving means 150 to the column 103a, and the other cutting means 120 is supported through the Y moving means 140 and the Z moving means 150 to the column 103b.

Each cutting means 120 is adapted to be moved by the Y moving means 140 and the Z moving means 150 to thereby set the cutting blade 121 at an arbitrary position above the holding surface 110a of the chuck table 110. Further, although not depicted, imaging means for imaging the front side (upper surface) of the workpiece W held on the chuck table 110 is fixed to one of the two cutting means 120, so that the imaging means is movable with this cutting means 120. This imaging means include a charge-coupled device (CCD) camera for imaging a target area of the workpiece W to be divided. That is, the CCD camera functions to image the workpiece W held on the chuck table 110 and thereby obtain an image for use in performing alignment between the workpiece W and the cutting blade 121. This image obtained by the imaging means is output to the control means 160.

The cutting blade 121 is a substantially ringlike cutting abrasive having a very small thickness. By rotating the spindle, the cutting blade 121 is rotated to thereby cut the workpiece W. The spindle is accommodated in a spindle housing (not depicted), which is supported to the Z moving means 150. The axis of rotation of the spindle and the cutting blade 121 of each cutting means 120 is parallel to the Y direction.

The X moving means is feeding means for moving the chuck table 110 in the X direction to thereby feed the chuck table 110 in the X direction. The Y moving means 140 is indexing means for moving each cutting means 120 in the Y direction to thereby index each cutting means 120 in the Y direction. The Z moving means 150 is means for moving each cutting means 120 in the Z direction to thereby feed each cutting means 120 in the Z direction. Each of the X moving means, the Y moving means 140, and the Z moving means 150 includes a known ball screw rotatable about its axis, a known pulse motor for rotating the ball screw about its axis, and a pair of guide rails for supporting the chuck table 110 or each cutting means 120 so as to allow the movement thereof in the X direction, the Y direction, or the Z direction.

The cutting apparatus 100 further includes a cassette elevator 170 for mounting a cassette 171 and moving it in the Z direction, cleaning means 180 for cleaning the workpiece W after cutting, and transfer means 190 for taking the workpiece W out of the cassette 171 before cutting and for storing the workpiece W into the cassette 171 after cutting. The cassette 171 can store a plurality of workpieces W before and after cutting. The cleaning means 180 has a chuck table 181 for holding the workpiece W under suction after cutting, wherein the workpiece W held on the chuck table 181 is cleaned. The chuck table 181 of the cleaning means 180 has the same configuration as that of the chuck table 110. Accordingly, the same parts as those of the chuck table 110 are denoted by the same reference symbols and the description thereof will be omitted.

The control means 160 functions to control each component mentioned above and perform a suitable cutting operation to the workpiece W in the cutting apparatus 100. The control means 160 includes a computer system. For example, the control means 160 includes an operational processing unit having a microprocessor such as central processing unit (CPU), a storage unit having a memory such as read only memory (ROM) and random access memory (RAM), and an input/output interface unit. The operational processing unit of the control means 160 functions to perform operational processing according to a computer program stored in the storage unit and output a control signal through the input/output interface unit to each component of the cutting apparatus 100, thereby controlling the cutting apparatus 100. Although not depicted, the control means 160 is also connected to display means such as a liquid crystal display for displaying an operational condition, an image, etc. and input means to be used by an operator in recording information on cutting operation. Examples of the input means include a touch panel provided on the display means and a keyboard.

While the cutting apparatus 100 is depicted as the processing apparatus in the first preferred embodiment, the processing apparatus of the present invention is not limited to the cutting apparatus 100, but may be a cleaning apparatus, laser processing apparatus, or grinding apparatus. While the cutting means 120 is depicted as the processing unit in the first preferred embodiment, the processing unit in the present invention is not limited to the cutting means 120, but may be a cleaning unit, laser beam applying unit, or grinding unit. Thus, while the processing in the first preferred embodiment is a cutting operation, the processing in the present invention is not limited to such a cutting operation, but may be a cleaning operation, laser processing operation, or grinding operation.

The plate-shaped workpiece transfer apparatus 1 as the transfer unit functions to transfer the workpiece W to/from the holding surface 110a of the chuck table 110 or 181. In the first preferred embodiment, the cutting apparatus 100 includes a first plate-shaped workpiece transfer apparatus 1A for transferring the workpiece W between the transfer means 190 and the chuck table 110 and a second plate-shaped workpiece transfer apparatus 1B for transferring the workpiece W between the chuck table 110 and the chuck table 181 of the cleaning means 180. The first plate-shaped workpiece transfer apparatus 1A functions to transfer the workpiece W from the transfer means 190 to the chuck table 110 before cutting. The second plate-shaped workpiece transfer apparatus 1B functions to transfer the workpiece W from the chuck table 110 to the chuck table 181 of the cleaning means 180 after cutting. The first plate-shaped workpiece transfer apparatus 1A functions to transfer the workpiece W from the chuck table 181 to the transfer means 190 after cleaning. The configuration of the first plate-shaped workpiece transfer apparatus 1A is the same as that of the second plate-shaped workpiece transfer apparatus 1B.

Figure 2:
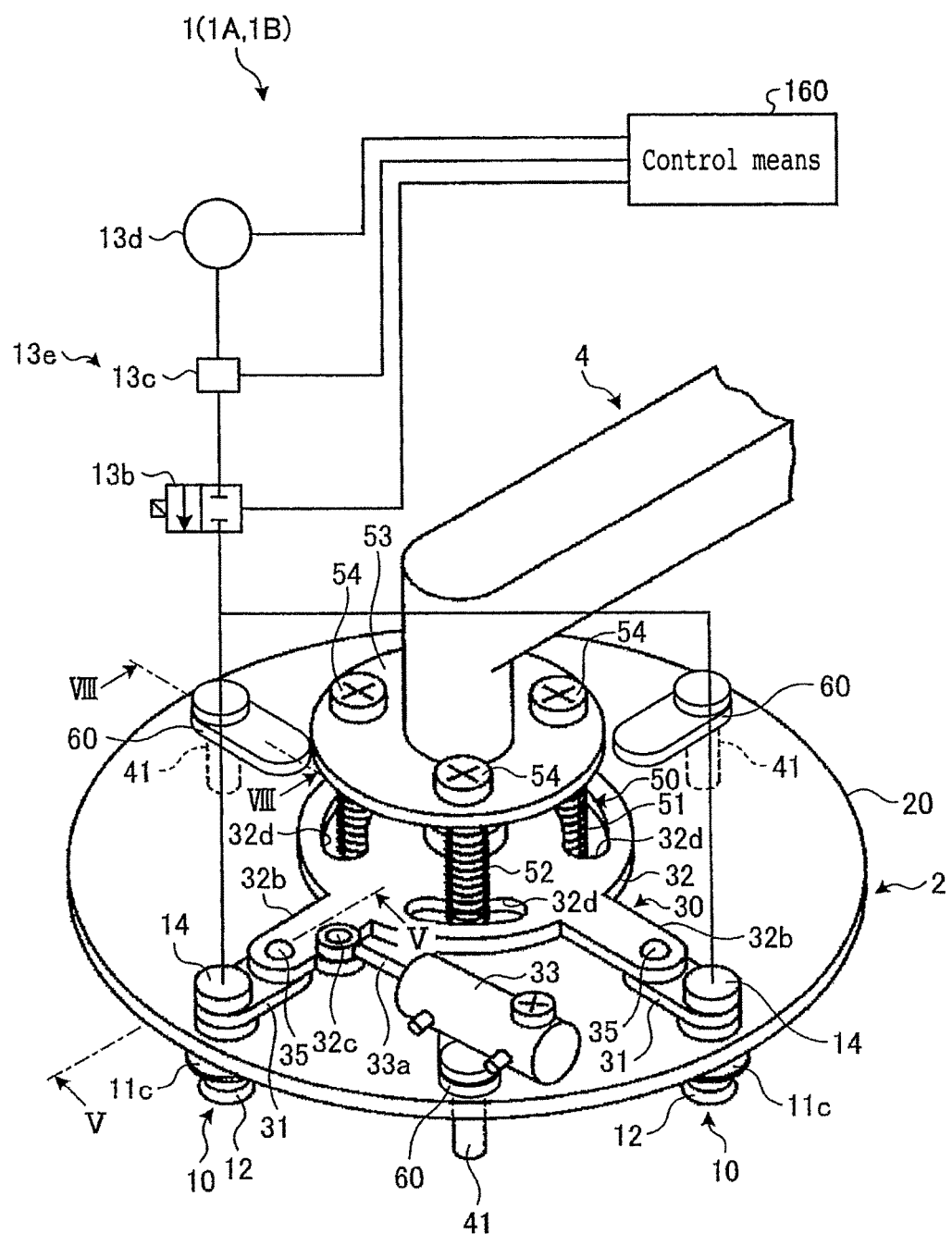
FIG. 2 is a perspective view depicting the configuration of the plate-shaped workpiece transfer apparatus according to the first preferred embodiment.
Figure 3:
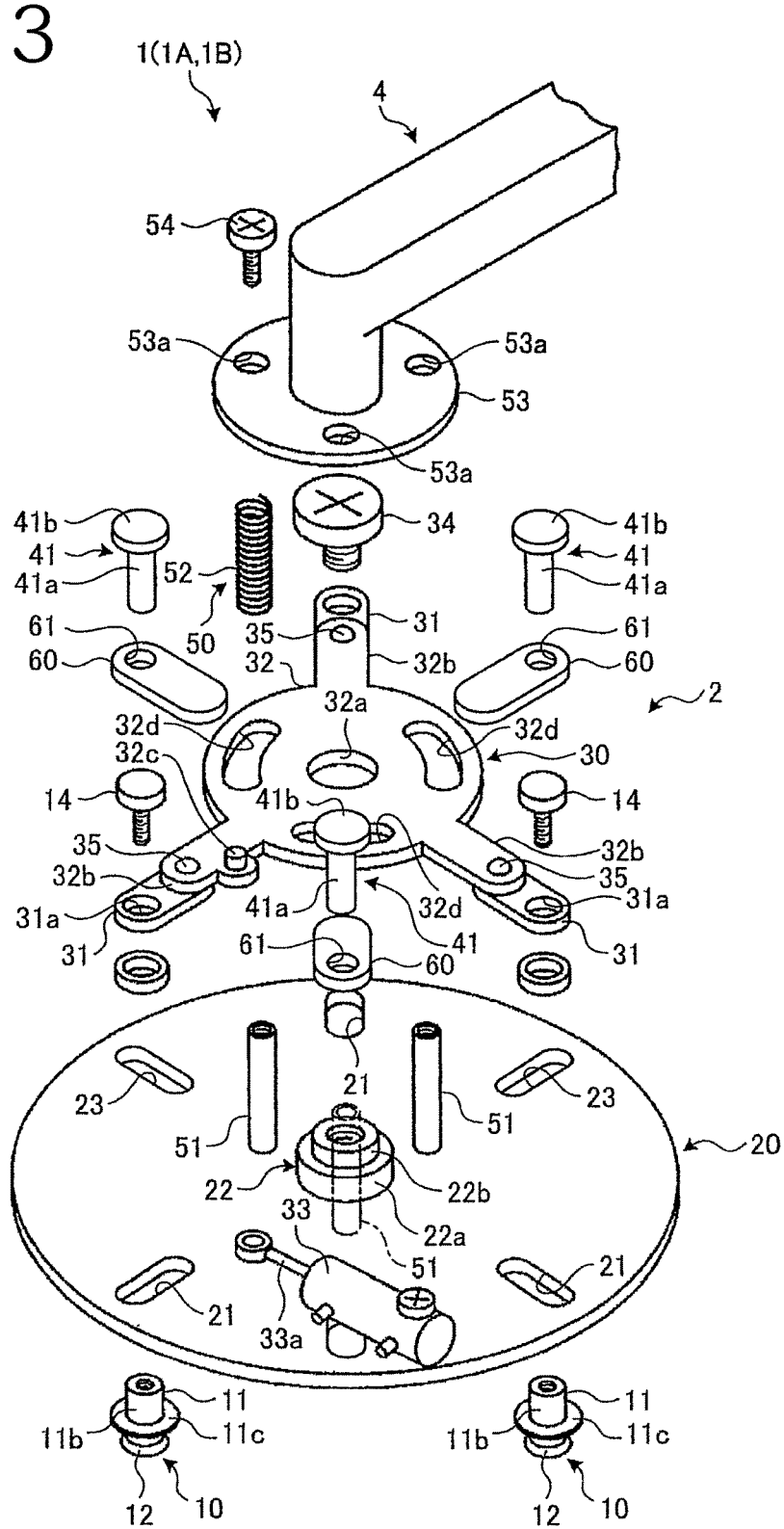
FIG. 3 is an exploded perspective view of the plate-shaped workpiece transfer apparatus depicted in FIG. 2.

As depicted in FIGS. 2 and 3, the plate-shaped workpiece transfer apparatus 1 includes a holding unit 2 for holding the workpiece W and a moving mechanism 3 (see FIG. 1) for moving the holding unit 2. The holding unit 2 is supported to a unit supporting arm 4. The moving mechanism 3 includes a Y moving mechanism 5 (see FIG. 1) for horizontally moving the unit supporting arm 4 in the Y direction and an elevating mechanism (not depicted) for vertically moving the holding unit 2 supported to the front end (lower end) of the unit supporting arm 4 in the Z direction. That is, the holding unit 2 is supported through the unit supporting arm 4 to a double column type support structure as depicted in FIG. 1. This double column type support structure is composed of a pair of columns 104a and 104b provided on the upper surface of the base housing 102 and a horizontal bar 104c connecting the upper ends of the two columns 104a and 104b. The Y moving mechanism 5 is provided on the horizontal bar 104c. The Y moving mechanism 5 includes a known ball screw rotatable about its axis, a known pulse motor for rotating the ball screw about its axis, and a pair of known guide rails for supporting the unit supporting arm 4 so as to allow the movement thereof in the Y direction. The elevating mechanism includes a known air cylinder.

As depicted in FIGS. 2 and 3, the holding unit 2 includes at least two (e.g., three in this preferred embodiment) holding members 10 for holding the outer edge of the workpiece W, a support plate 20 for supporting the holding members 10 so as to allow the movement of the holding members 10 in a moving direction toward or away from the outer edge of the workpiece W, i.e., in the radial direction of the circular support plate 20, and a moving unit 30 for moving the holding members 10 in the moving direction mentioned above.

Figure 4:
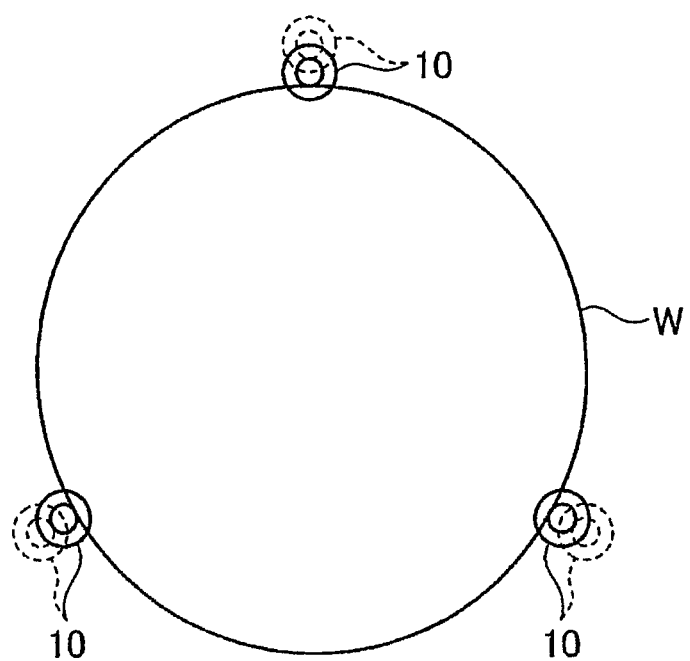
FIG. 4 is a plan view depicting the arrangement of three holding members included in the plate-shaped workpiece transfer apparatus depicted in FIG. 2.
Figure 5:
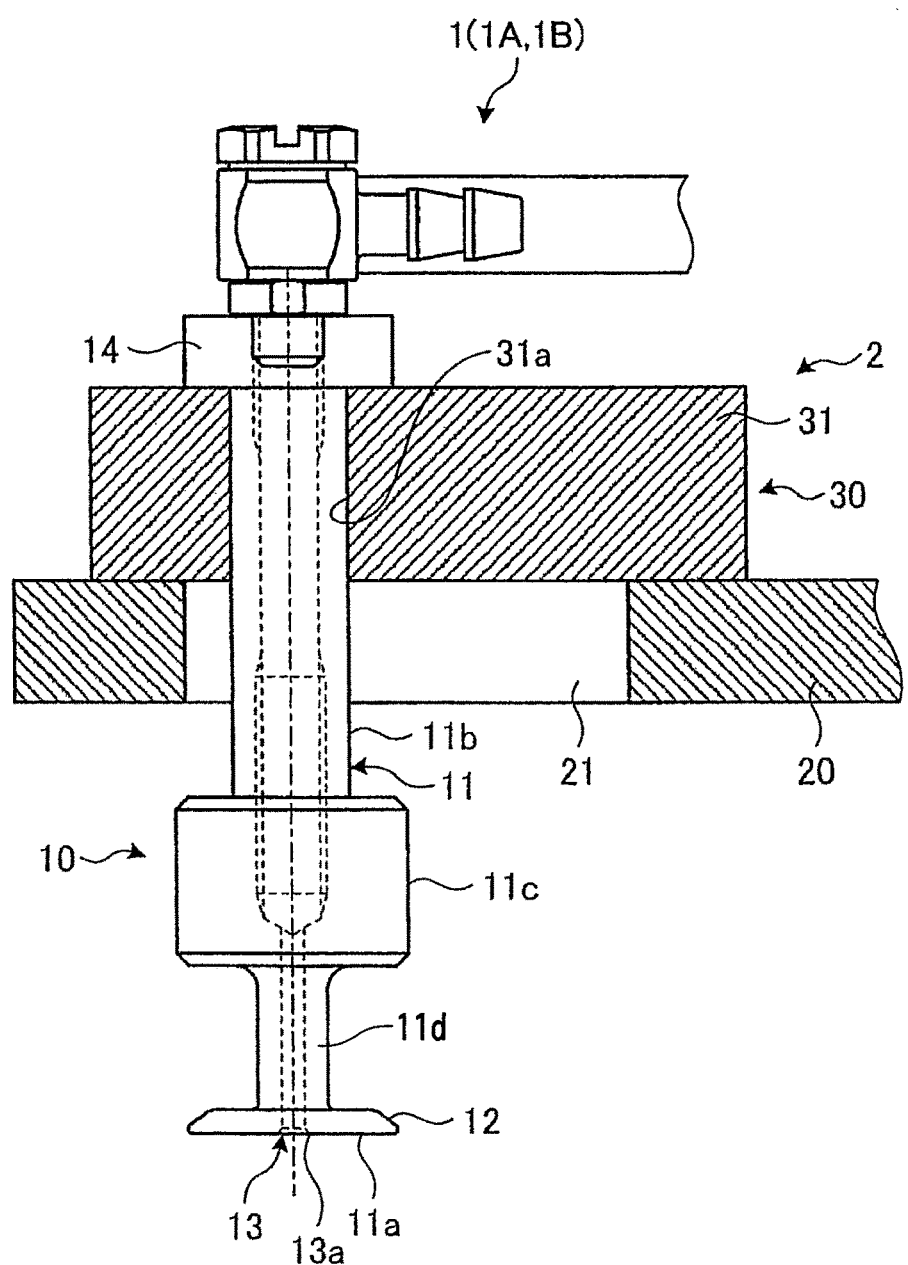
FIG. 5 is a cross section taken along the line V-V in FIG. 2.
Figure 6:
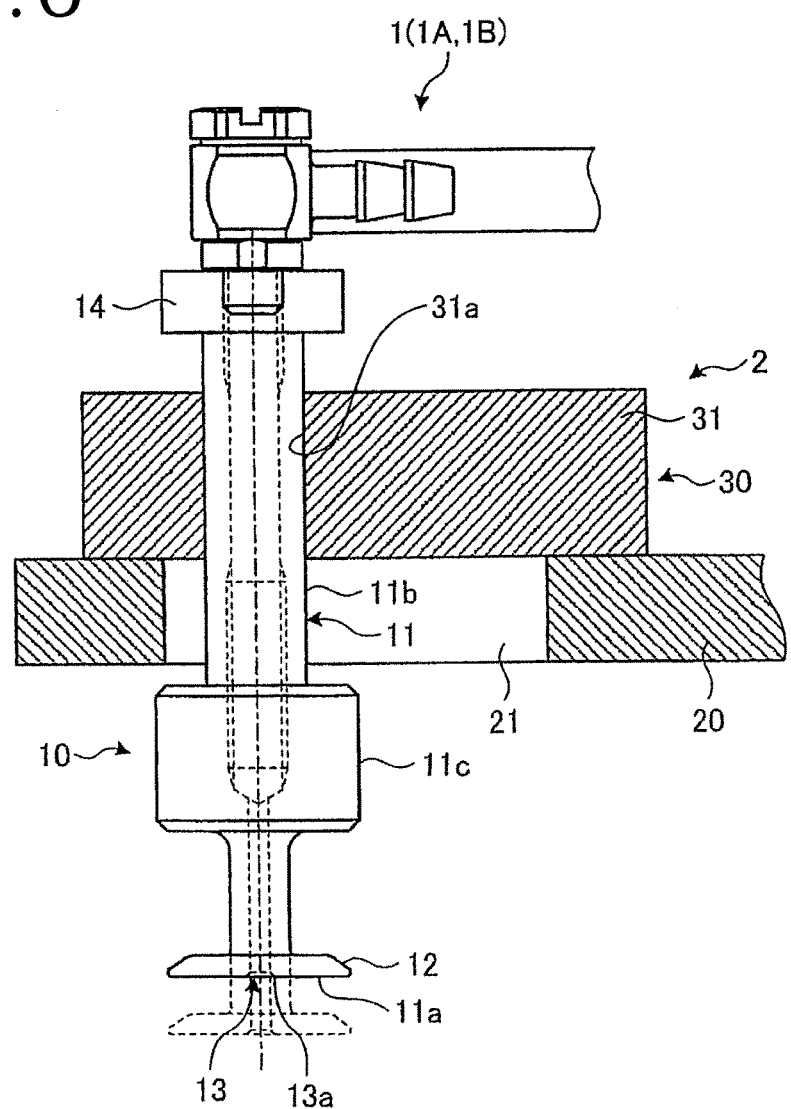
FIG. 6 is a view similar to FIG. 5, depicting a condition where each holding member is vertically moved.

As depicted in FIG. 4, the three holding members 10 in the first preferred embodiment are located at equal intervals around the workpiece W along the outer circumference thereof, i.e., in the circumferential direction of the circular support plate 20. As depicted in FIGS. 5 and 6, each holding member 10 includes a rod portion 11 vertically movably extending downward through the support plate 20 in perpendicular relation thereto, an engaging portion 12 formed on the outer circumference of the rod portion 11 at the lower end thereof for engaging the outer edge of the workpiece W, and a nozzle portion 13 for discharging a fluid from the lower surface 11a of the rod portion 11 toward the holding surface 110a to thereby float the workpiece W from the holding surface 110a. The rod portion 11 is a cylindrical portion stepwise changed in outer diameter. The fluid to be discharged by the nozzle portion 13 is air, for example.

The rod portion 11 includes a small-diameter portion 11b inserted in an elongated hole 21 of the support plate 20 and a large-diameter portion 11c larger in diameter than the small-diameter portion 11b. The small-diameter portion 11b has an outer diameter smaller than the width of the elongated hole 21 and has an axial length larger than the thickness of the support plate 20. The large-diameter portion 11c has an outer diameter larger than the width of the elongated hole 21. The large-diameter portion 11c is connected at its upper end to the lower end of the small-diameter portion 11b. The rod portion 11 further includes a smallest-diameter portion 11d smaller in diameter than the small-diameter portion 11b. The smallest-diameter portion 11d is connected at its upper end to the lower end of the large-diameter portion 11c. Thus, the small-diameter portion 11b of the rod portion 11 is loosely inserted through the elongated hole 21 of the support plate 20. As depicted by a solid line and a broken line in FIG. 6, the rod portion 11, or each holding member 11 is vertically movable. Further, a disk-shaped member 14 like a screw is mounted on the upper end of the rod portion 11. The disk-shaped member 14 has an outer diameter larger than the diameter of a circular hole 31a of a link 31 to be hereinafter described. The disk-shaped member 14 mounted to the rod portion 11 is adapted to come into contact with the link 31, and the large-diameter portion 11c of the rod portion 11 is adapted to come into contact with the support plate 20, so that the rod portion 11, or each holding member 10 is prevented from falling down from the support plate 20.

The engaging portion 12 is a disk-shaped portion radially projecting from the outer circumference of the rod portion 11 at the lower end thereof. The engaging portion 12 has a tapering peripheral portion gradually reduced in thickness toward the outer circumference thereof. In the first preferred embodiment, the lower surface of the engaging portion 12 is a flat surface flush with the lower surface 11a of the rod portion 11. The upper surface of the tapering peripheral portion of the engaging portion 12 is inclined downward so as to gradually approach the lower surface toward the outer circumference.

Figure 7:
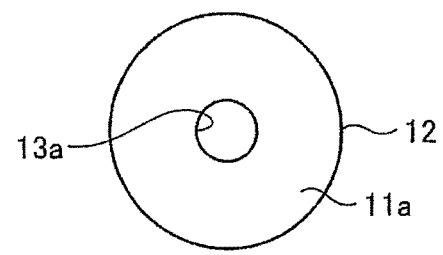
FIG. 7 is a plan view depicting a lower surface of a rod portion of each holding member depicted in FIG. 5.

The nozzle portion 13 includes a nozzle 13a opening to the lower surface 11a of the rod portion 11 and a fluid supply portion 13e (see FIG. 2) for supplying a fluid to the nozzle 13a. As depicted in FIG. 2, the fluid is supplied from a fluid source 13d through a flow control valve 13c and a selector valve 13b to the nozzle 13a. As depicted in FIG. 7, the nozzle 13a opens to the center of the lower surface 11a of the rod portion 11. In the first preferred embodiment, the fluid to be supplied by the fluid supply portion 13e and discharged from the nozzle 13a is a pressurized gas.

As depicted in FIGS. 2 and 3, the support plate 20 is a circular plate. The peripheral portion of the support plate 20 is formed with three elongated holes 21 arranged at given intervals in the circumferential direction. Each elongated hole 21 is elongated in the radial direction of the support plate 20. The small-diameter portions 11b of the rod portions 11 of the three holding members 10 in this preferred embodiment are inserted through the respective three elongated holes 21. The width of each elongated hole 21 is slightly larger than the outer diameter of the small-diameter portion 11b of each holding member 10. In mounting each holding member 10, the small-diameter portion 11b of each holding member 10 is inserted through each elongated hole 21 from the lower side of the support plate 20 as depicted in FIG. 3. A stepped nut 22 having a large-diameter portion 22a and a small-diameter portion 22b is mounted on the upper surface of the support plate 20 at the center thereof.

The moving unit 30 functions to move the three holding members 10 inserted through the respective three elongated holes 21 of the support plate 20, in the longitudinal direction of each elongated hole 21, i.e., in the radial direction of the support plate 20. The moving unit 30 is composed of three links 31 pivotably connected at one end portions thereof to the small-diameter portions 11b of the respective three holding members 10, a rotatable plate 32 for pivotably supporting the other end portions of the three links 31, and an air cylinder 33 as driving means for rotating the rotatable plate 32. As depicted in FIG. 3, one end portion of each link 31 is formed with a circular hole 31a through which the small-diameter portion 11b of each holding member 10 is loosely inserted. In mounting each holding member 10, the small-diameter portion 11b is loosely inserted through the circular hole 31a of each link 31 from the lower side thereof, and the disk-shaped member 14 like a screw is mounted to the small-diameter portion 11b. The disk-shaped member 14 has a threaded stem portion adapted to engage with a screw hole formed in the small-diameter portion 11b of each holding member 10.

The rotatable plate 32 has a central hole 32a for loosely engaging the small-diameter portion 22b of the stepped nut 22 mounted on the upper surface of the support plate 20 at the center thereof. The rotatable plate 32 further has three arms 32b projecting radially outward from the outer circumference of the rotatable plate 32. These three arms 32b are arranged at given intervals in the circumferential direction of the rotatable plate 32. The outer end portions of the three arms 32b are pivotably connected through pivot shafts 35 to the other end portions of the respective three links 31. One of the three arms 32b is provided with a connecting projection 32c connected to a piston rod 33a of the air cylinder 33. The rotatable plate 32 further has three arcuate openings 32d around the central hole 32a. The three arcuate openings 32d are arranged at given intervals in the circumferential direction of the rotatable plate 32. In mounting the rotatable plate 32 to the support plate 20, the central hole 32a of the rotatable plate 32 is loosely engaged with the small-diameter portion 22b of the stepped nut 22, and a bolt 34 is threadedly engaged with the stepped nut 22, thereby preventing disengagement of the rotatable plate 32.

The air cylinder 33 is provided on the upper surface of the support plate 20. The piston rod 33a of the air cylinder 33 is connected at its front end to the connecting projection 32c formed on one of the three arms 32b.

Figure 8:
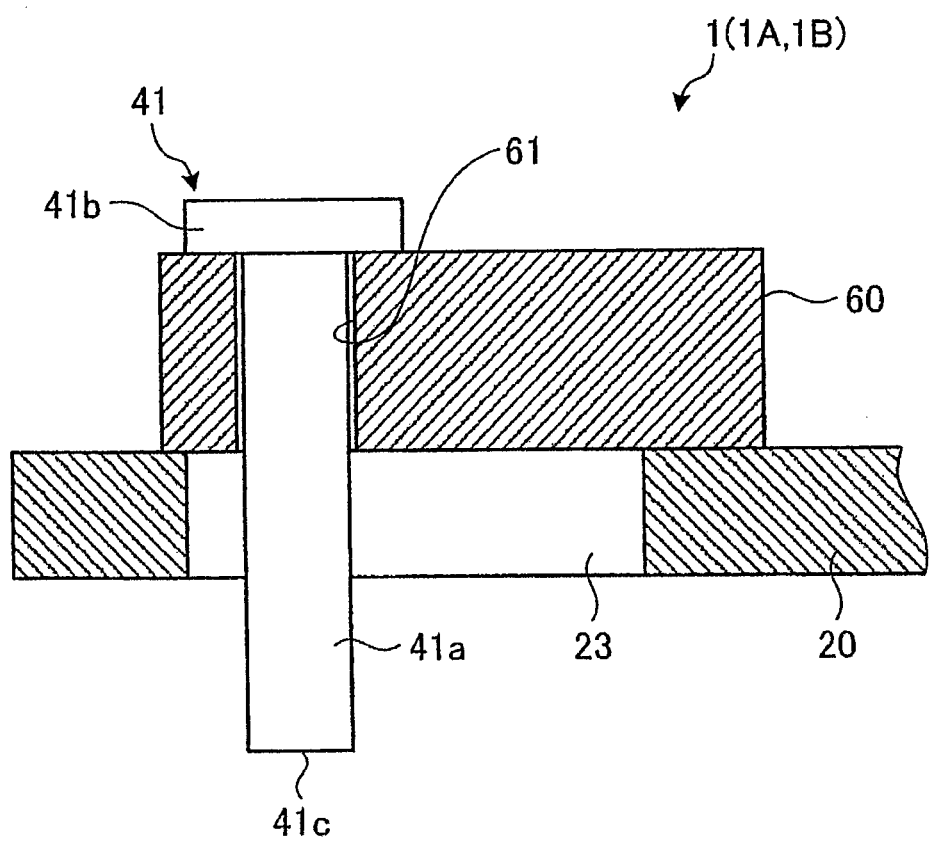
FIG. 8 is a cross section taken along the line VIII-VIII in FIG. 2.

The holding unit 2 further includes three restriction pins 41 for restricting the movement of the workpiece W in a direction parallel to the holding surface 110a. The three restriction pins 41 are arranged at given intervals in the circumferential direction of the support plate 20. FIG. 8 is a cross section taken along the line VIII-VIII in FIG. 2.

More specifically, the three restriction pins 41 are arranged at equal intervals in the circumferential direction of the support plate 20 in such a manner that each restriction pin 41 is interposed between any adjacent ones of the three holding members 10. The peripheral portion of the support plate 20 is formed with three elongated holes 23 elongated in the radial direction of the support plate 20. The three elongated holes 23 are arranged at equal intervals in the circumferential direction of the support plate 20. Three support members 60 are provided on the support plate 20 so as to correspond to the respective three elongated holes 23. Each support member 60 has a circular hole 61. As depicted in FIG. 8, each restriction pin 41 has a small-diameter portion 41a, a large-diameter portion 41b connected to the upper end of the small-diameter portion 41a, and a lower surface 41c formed at the lower end of the small-diameter portion 41a. The small-diameter portion 41a of each restriction pin 41 is inserted through each elongated hole 23 of the support plate 20 and the circular hole 61 of each support member 60. The large-diameter portion 41b of each restriction pin 41 has an outer diameter larger than the inner diameter of each circular hole 61. In mounting each restriction pin 41, the small-diameter portion 41a is inserted through the circular hole 61 and the elongated hole 23 until the large-diameter portion 41b abuts against the upper surface of the support member 60 and the small-diameter portion 41a projects downward from the lower surface of the support plate 20 in perpendicular relation thereto.

In transferring the workpiece W to the holding surface 110a by operating the plate-shaped workpiece transfer apparatus 1, each restriction pin 41 is positioned slightly above the holding surface 110a around the outer circumference of the workpiece W held by each holding member 10. Accordingly, each restriction pin 41 is provided in order to prevent the possibility that the workpiece W may be horizontally moved so as to adhere to each holding member 10 in radially moving each holding member 10 away from the workpiece W.

The plural restriction pins 41 are located outside the workpiece W so as to be slightly spaced from the outer circumference of the workpiece W. The inner diameter of each circular hole 61 for allowing insertion of each restriction pin 41 is slightly larger than the outer diameter of the small-diameter portion 41a of each restriction pin 41. That is, a small gap is defined between the small-diameter portion 41a and the circular hole 61, so that the lower end of each restriction pin 41 can be oscillated slightly due to this small gap so as to be displaced in the radial direction of the support plate 20, i.e., in the moving direction of each holding member 10 to be moved by the moving unit 30. As described above, each restriction pin 41 is located outside the workpiece W so as to be slightly spaced from the outer circumference of the workpiece W, and can be oscillated due to the small gap between the small-diameter portion 41a and the circular hole 61. Accordingly, there is no possibility that the lower surface 41c of each restriction pin 41 may come into contact with the workpiece W in suppressing the horizontal displacement of the workpiece W.

The holding unit 2 is supported to the front end of the unit supporting arm 4 by elastic supporting means 50 as depicted in FIGS. 2 and 3. The elastic supporting means 50 includes three support columns 51 provided on the upper surface of the support plate 20, three coil springs 52 loosely engaged with the respective three support columns 51, and a mount plate 53 mounted to the front end of the unit supporting arm 4. The three support columns 51 are located so as to be inserted through the respective three arcuate openings 32d of the rotatable plate 32. The upper end portion of each support column 51 is formed with an internally threaded hole for engaging a bolt 54. The mount plate 53 has three insert holes 53a corresponding to the respective three support columns 51. Each insert hole 53a has an inner diameter larger than the outer diameter of each support column 51 and smaller than the outer diameter of each coil spring 52. Accordingly, when the three support columns 51 are inserted through the respective three insert holes 53a and the three bolts 54 are threadedly engaged with the internally threaded holes of the respective three support columns 51, the holding unit 2 is elastically supported to the front end of the unit supporting arm 4 so as to be biased downward by the three coil springs 52.

Figure 9:
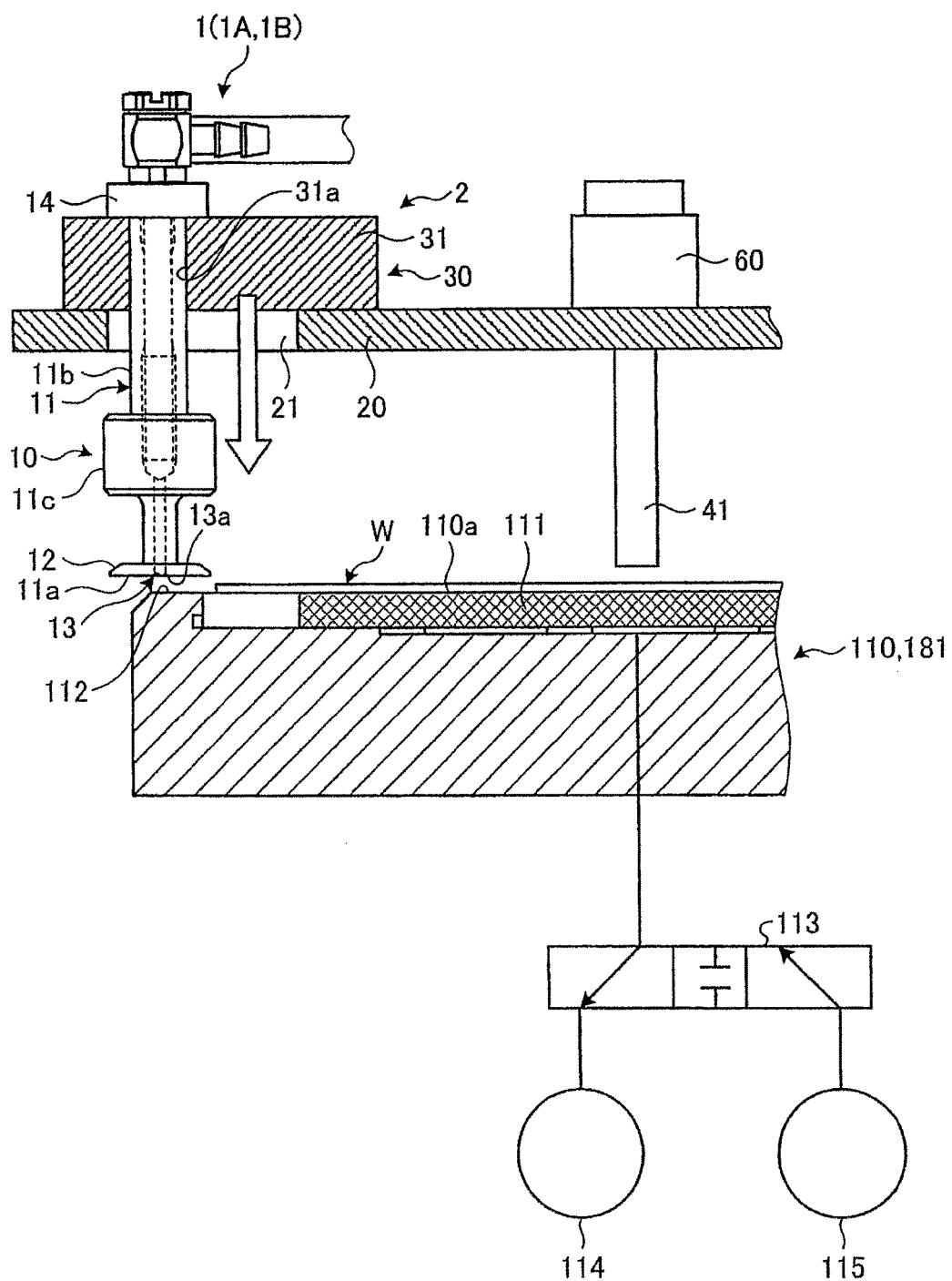
FIG. 9 is a sectional view depicting an essential part of a holding unit in the condition where the plate-shaped workpiece transfer apparatus has come close to a chuck table holding a workpiece.
Figure 10:
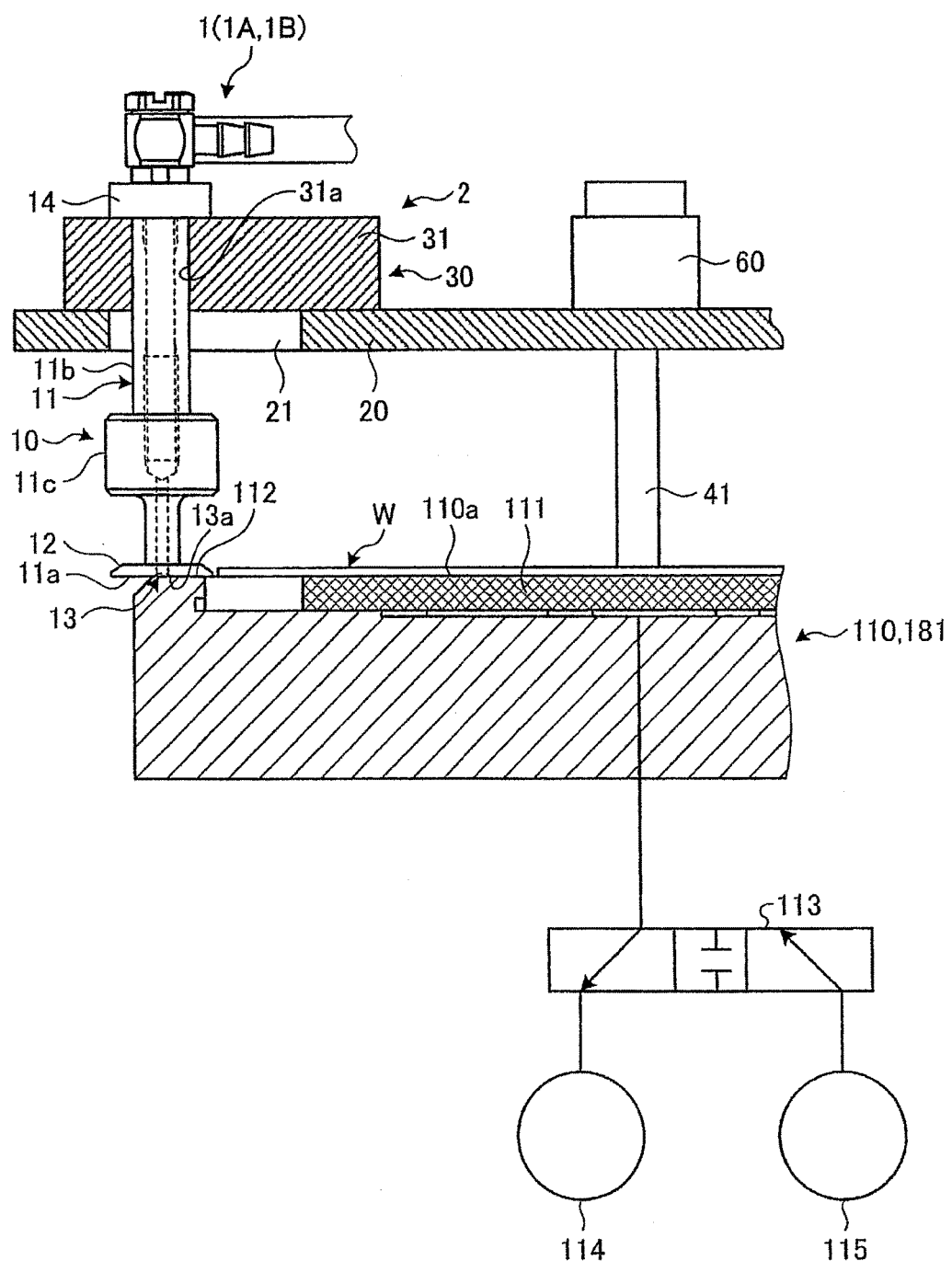
FIG. 10 is a view similar to FIG. 9, depicting a condition that each holding member has been positioned.
Figure 11:
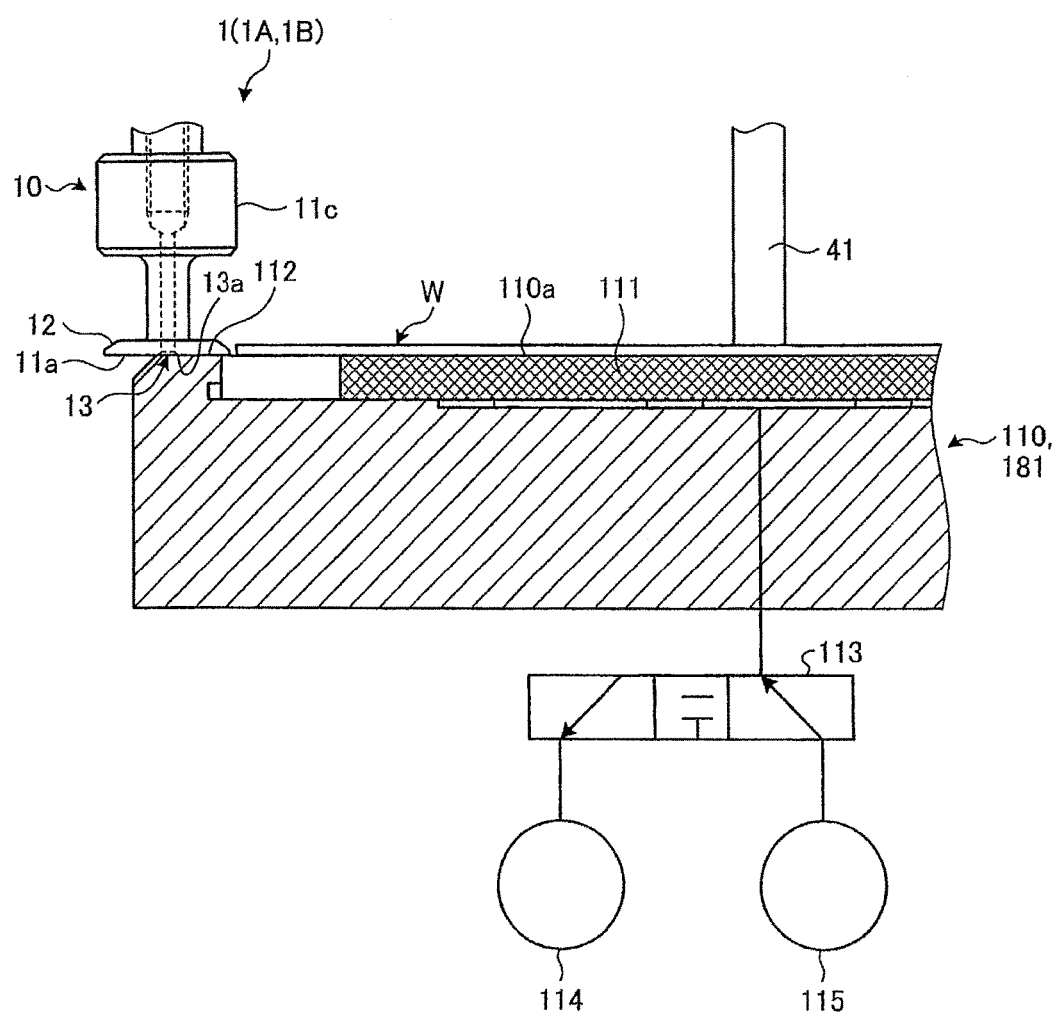
FIG. 11 is a view similar to FIG. 10, depicting a condition that a gas has been discharged from the chuck table.
Figure 12:
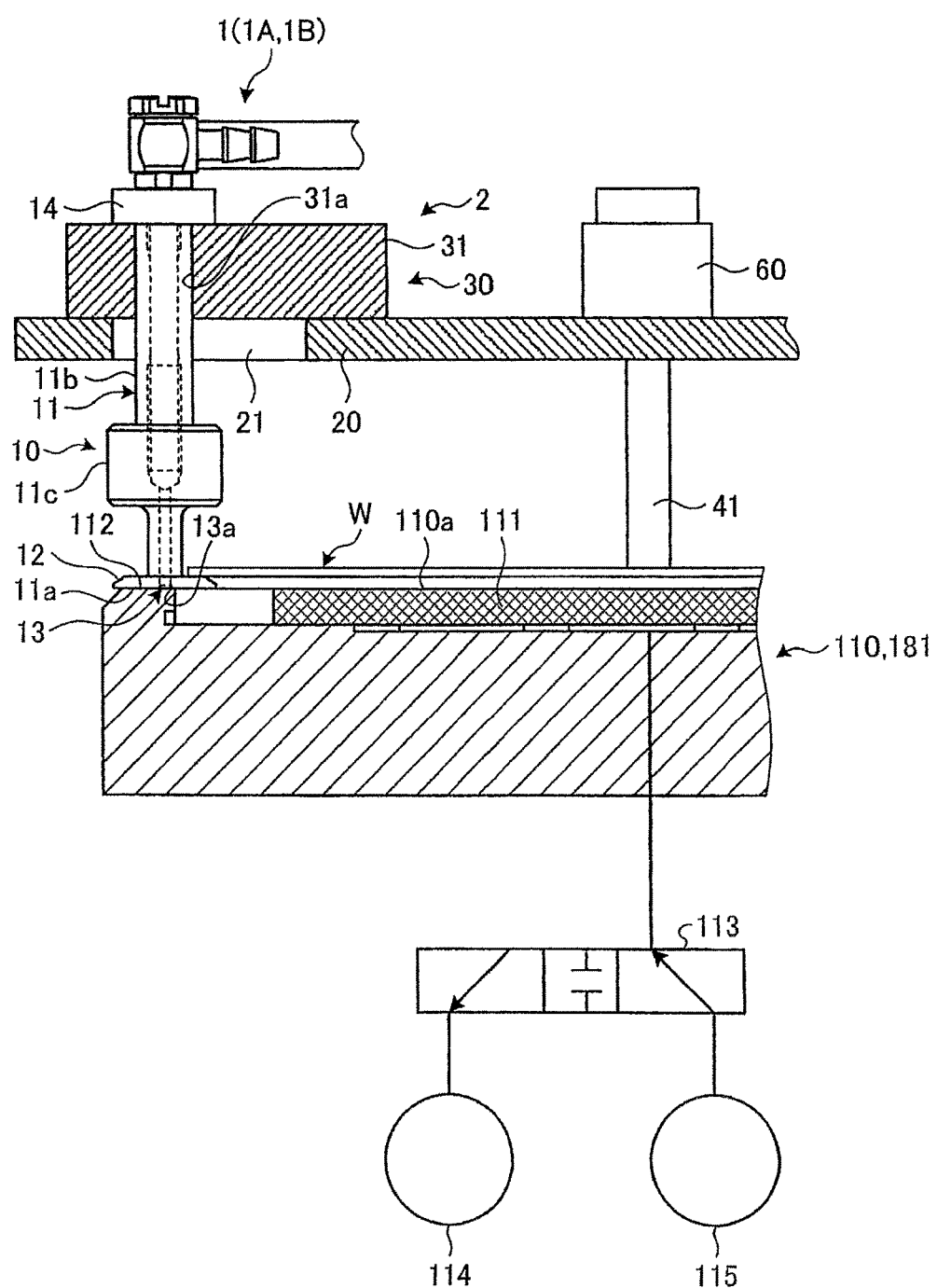
FIG. 12 is a view similar to FIG. 11, depicting a condition that the workpiece has been held by each holding member.

The operation of the plate-shaped workpiece transfer apparatus 1 according to the first preferred embodiment will now be described. In the following description, there will be representatively described the operation of transferring the workpiece W from the chuck table 110 or 181 by operating the first or second plate-shaped workpiece transfer apparatus 1A or 1B. However, the operation of transferring the workpiece W from the transfer means 190 is also similarly performed by the first plate-shaped workpiece transfer apparatus 1A. FIG. 9 is a sectional view of an essential part of the holding unit 2 in the condition where the plate-shaped workpiece transfer apparatus 1 has come close to the chuck table 110 or 181. FIG. 10 is a view similar to FIG. 9, depicting a condition that each holding member 10 of the plate-shaped workpiece transfer apparatus 110 or 181 has been positioned. FIG. 11 is a view similar to FIG. 10, depicting a condition that a gas has been discharged from the chuck table 110 or 181. FIG. 12 is a view similar to FIG. 11, depicting a condition that the workpiece W has been held by each holding member 10 of the plate-shaped workpiece transfer apparatus 110 or 181.

In transferring the workpiece W from the chuck table 110 or 181 by operating the plate-shaped workpiece transfer apparatus 1, the plate-shaped workpiece transfer apparatus 1 comes close to the chuck table 110 or 181 as depicted in FIG. 9 in the condition where the control means 160 is operated to extend the piston rod 33a of the air cylinder 33 and supply a fluid from the fluid source 13d to the nozzle 13a at a predetermined flow rate, then discharging the fluid from the nozzle 13a. At this time, the control means 160 is operated to apply a vacuum from the vacuum source 114 to the holding surface 110a, thereby holding the workpiece W on the holding surface 110a under suction as depicted in FIG. 9.

When each holding member 10 of the holding unit 2 approaches the frame portion 112 of the chuck table 110 or 181, each holding member 10 is prevented from coming into contact with the frame portion 112 of the chuck table 110 or 181 because the fluid is discharged from the nozzle 13a. Further, the fluid discharged from the nozzle 13a is allowed to flow along the upper surface of the frame portion 112, thereby producing a Bernoulli effect. Due to this Bernoulli effect, the lower surface 11a of the rod portion 11 is attracted to the frame portion 112 of the chuck table 110 or 181. As a result, the height of each holding member 10 (the height of the lower surface 11a of the rod portion 11) is set at a level slightly higher than the holding surface 110a owing to the Bernoulli effect by the fluid as depicted in FIG. 10. At this time, each restriction pin 41 does not come into contact with the frame portion 112 of the chuck table 110 or 181, and the lower surface 41c of each restriction pin 41 is set at a level lower than the upper surface of the workpiece W held on the holding surface 110a of the chuck table 110 or 181 as depicted in FIG. 10.

Thereafter, the control means 160 is operated to control the selector valve 113 and supply the gas from the gas source 115 to the holding surface 110a of the chuck table 110 or 181, thereby blowing the gas from the holding surface 110a toward the workpiece W as depicted in FIG. 11. As a result, the workpiece W is slightly floated from the holding surface 110a by the gas blown. Further, the fluid discharged from the nozzle 13a is allowed to enter the gap defined between the holding surface 110a and the workpiece W. In this condition, the control means 160 is operated to contract the piston rod 33a of the air cylinder 33, thereby moving each holding member 10 radially inward of the support plate 20. As a result, the engaging portion 12 of each holding member 10 is allowed to slide below the workpiece W and engage with the outer edge of the workpiece W in the condition where the workpiece W is kept floated from the holding surface 110a as depicted in FIG. 12. Thereafter, the plate-shaped workpiece transfer apparatus 1 holding the workpiece W is moved to transfer workpiece W from the chuck table 110 or 181 to the next stage.

In the plate-shaped workpiece transfer apparatus 1 and the cutting apparatus 100 according to the first preferred embodiment mentioned above, the nozzle 13a is formed so as to open to the lower surface 11a of the rod portion 11, and the engaging portion 12 for engaging the outer edge of the workpiece W is formed at the lower end of the rod portion 11. Further, each holding member 10 is vertically movably supported so as to project downward from the support plate 20. The fluid is discharged from the nozzle 13a to thereby automatically set the engaging portion 12 at a predetermined height from the holding surface 110a. Accordingly, it is unnecessary to adjust the position of each holding member 10 in suppressing the contact of each holding member 10 with the holding surface 110a. Furthermore, in the plate-shaped workpiece transfer apparatus 1 and the cutting apparatus 100, the fluid discharged from the nozzle 13a of each holding member 10 is allowed to flow along the holding surface 110a, thereby assisting the floating of the workpiece W from the holding surface 110a. As a result, the engaging portion 12 can be easily made to slide below the workpiece W.

Accordingly, it is possible to prevent the problem that the engaging portion 12 may come into contact with the holding surface 110a of the chuck table 110 or 181. Further, it is possible to easily adjust the moving unit 30. As a result, possible damage to the plate-shaped workpiece transfer apparatus 1 and the cutting apparatus 100 can be suppressed without the need for increasing the number of man-hours required for adjustment of the position of each part.

Figures 13A, 13B:
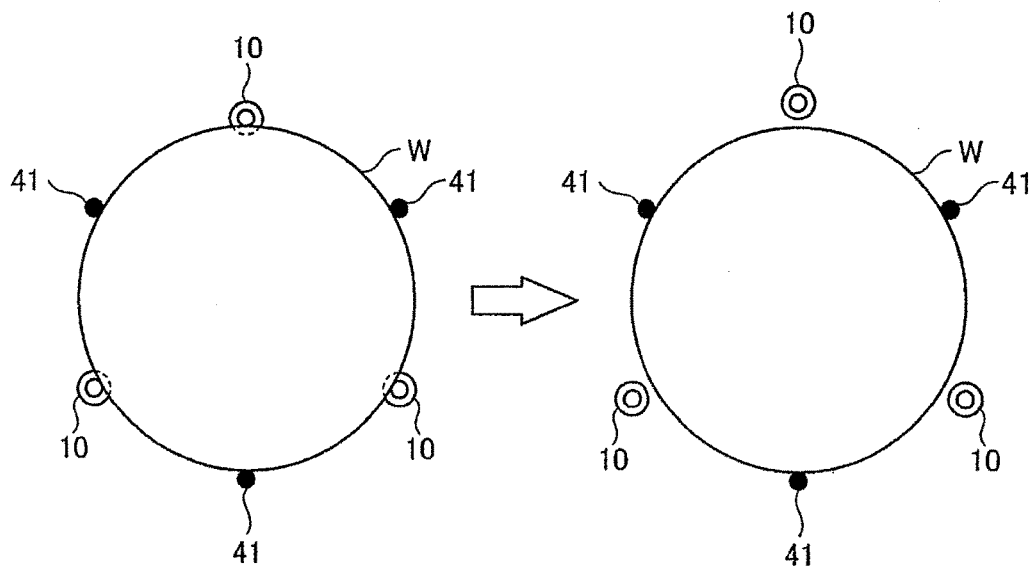
FIG. 13A is a plan view depicting the condition where the workpiece is held by the holding members of the plate-shaped workpiece transfer apparatus according to the first preferred embodiment.
FIG. 13B is a plan view depicting the condition where the holding members depicted in FIG. 13A have been separated from the workpiece.

Furthermore, in the plate-shaped workpiece transfer apparatus 1 and the cutting apparatus 100 according to the first preferred embodiment, the plural restriction pins 41 are provided around the outer circumference of the workpiece W held by the plural holding members 10, wherein each restriction pin 41 is vertically movably supported so as to project downward from the support plate 20. Accordingly, even when each holding member 10 is moved away from the workpiece W to switch from the condition where the workpiece W is held by each holding member 10 as depicted in FIG. 13A to the condition where the workpiece W is released from each holding member 10 as depicted in FIG. 13B, the horizontal displacement of the workpiece W is suppressed by each restriction pin 41. That is, as compared with the comparison depicted in FIGS. 14A and 14B, a change in position of the workpiece W can be suppressed according to the first preferred embodiment depicted in FIGS. 13A and 13B. Accordingly, the workpiece W can be always set at the same position on the chuck table 110 or 181.

Figures 14A, 14B:
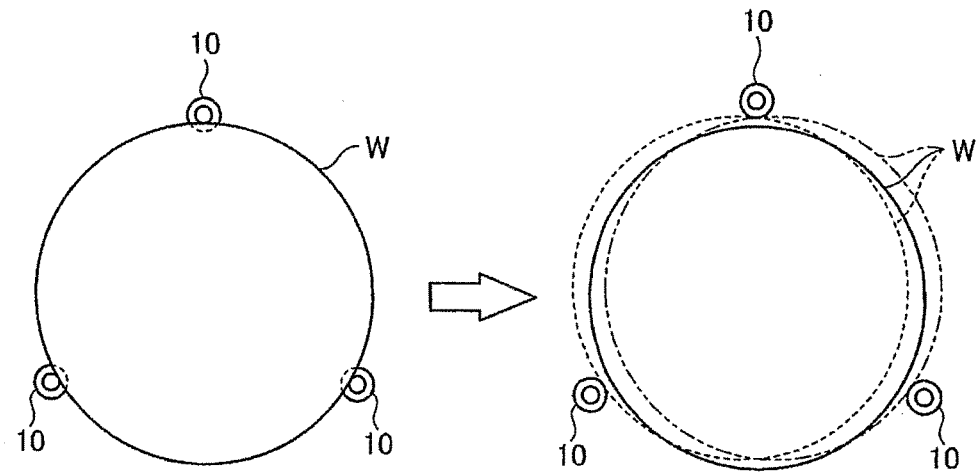
FIG. 14A is a plan view depicting the condition where the workpiece is held by the holding members of a plate-shaped workpiece transfer apparatus without restriction pins as a comparison.
FIG. 14B is a plan view depicting the condition where the holding members depicted in FIG. 14A have been separated from the workpiece.

More specifically, FIG. 13A is a plan view depicting the condition where the workpiece W is held by the holding members 10 of the plate-shaped workpiece transfer apparatus 1 according to the first preferred embodiment, and FIG. 13B is a plan view depicting the condition where the holding members 10 depicted in FIG. 13A have been separated from the workpiece W. FIG. 14A is a plan view depicting the condition where the workpiece W is held by the holding members 10 of a plate-shaped workpiece transfer apparatus without the restriction pins 41 as a comparison, and FIG. 14B is a plan view depicting the condition where the holding members 10 depicted in FIG. 14A have been separated from the workpiece W. In the comparison depicted in FIG. 14A, the restriction pins 41 are not provided. Accordingly, when the holding members 10 are separated from the workpiece W in the condition depicted in FIG. 14A, any one of the holding members 10 may adhere to the workpiece W to cause the horizontal displacement of the workpiece W as depicted by a broken line or a dot-dash line in FIG. 14B, so that the workpiece W may be moved along the holding surface 110a in the comparison.

Second Preferred Embodiment

Figure 15:
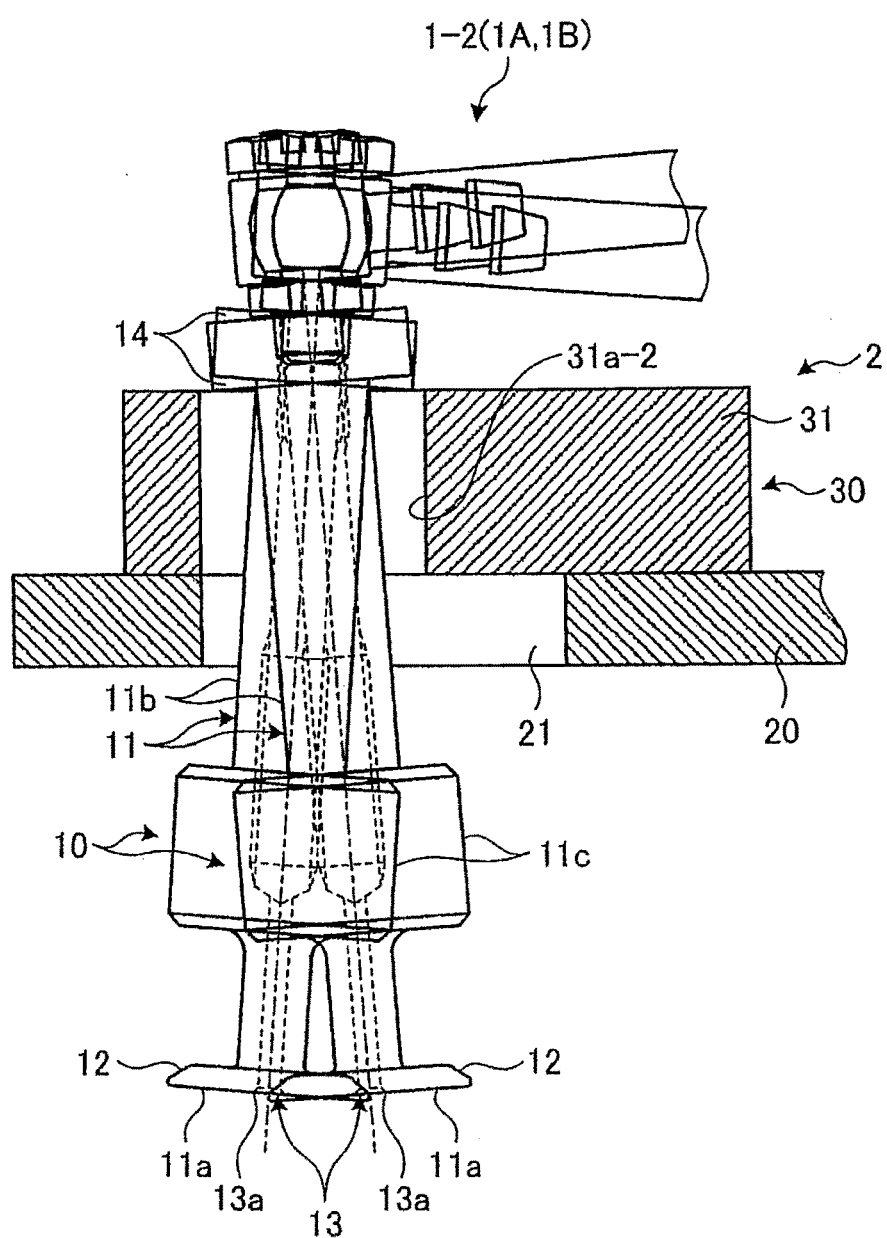
FIG. 15 is a sectional view of an essential part of a plate-shaped workpiece transfer apparatus according to a second preferred embodiment.
Figure 16:
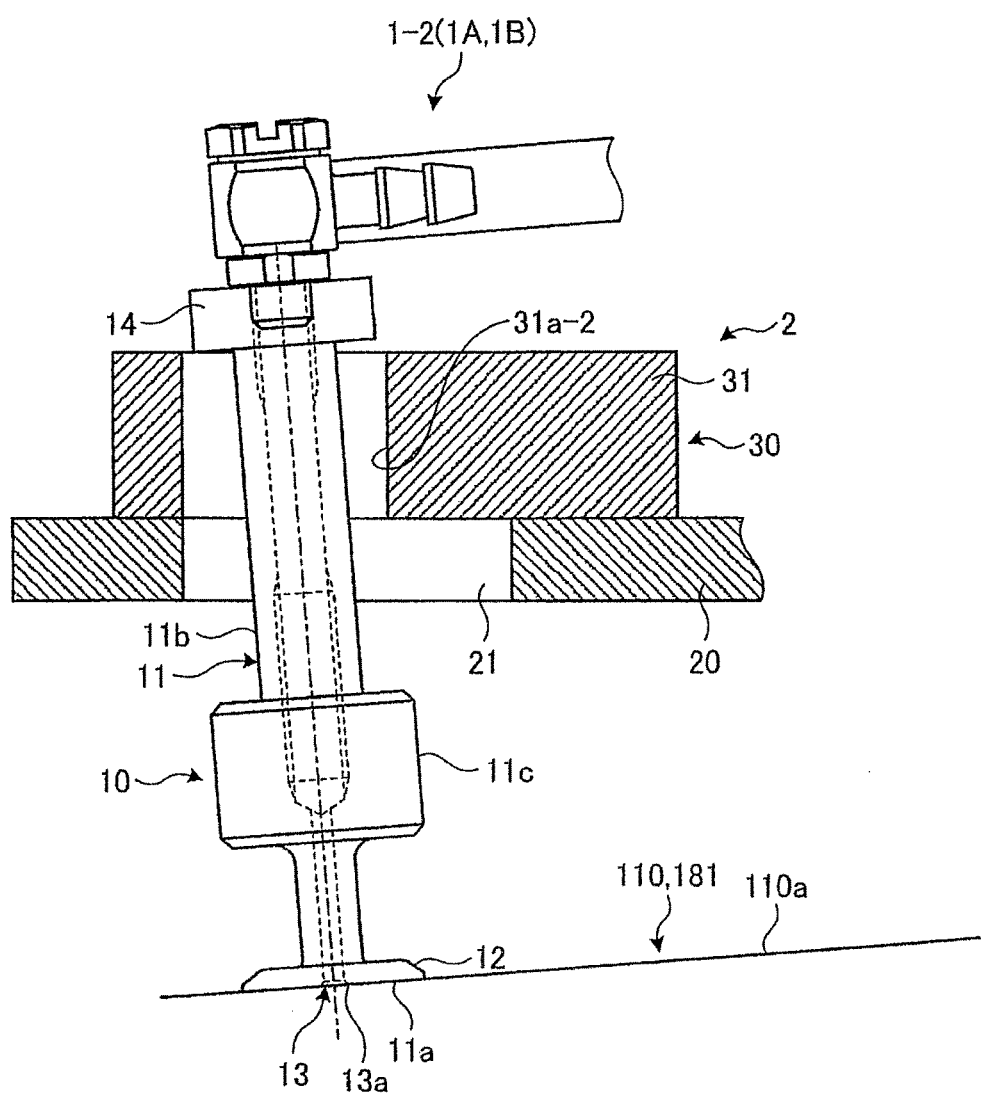
FIG. 16 is a sectional view depicting a condition that each holding member depicted in FIG. 15 has been oscillated.

A plate-shaped workpiece transfer apparatus and a processing apparatus according to a second preferred embodiment of the present invention will now be described with reference to the drawings. FIG. 15 is a sectional view of an essential part of the plate-shaped workpiece transfer apparatus according to the second preferred embodiment. FIG. 16 is a sectional view depicting a condition that each holding member depicted in FIG. 15 has been oscillated. In FIGS. 15 and 16, the same parts as those of the first preferred embodiment are denoted by the same reference symbols, and the description thereof will be omitted.

Referring to FIG. 15, there is depicted an essential part of a plate-shaped workpiece transfer apparatus 1-2 included in a cutting apparatus 100 (not depicted) as a processing apparatus according to the second preferred embodiment. As depicted in FIG. 15, a circular hole 31a-2 is formed at one end portion of each link 31. The small-diameter portion 11b of each holding member 10 is inserted through the circular hole 31a-2. The circular hole 31a-2 has an inner diameter larger than that of the circular hole 31a of the first preferred embodiment. The inner diameter of the circular hole 31a-2 is set so as to allow free tilt of the rod portion 11 as depicted in FIG. 15. Accordingly, each holding member 10 of the plate-shaped workpiece transfer apparatus 1-2 according to the second preferred embodiment is tiltably supported so as to project downward from the support plate 20 as depicted by a solid line in FIG. 15 so that the engaging portion 12 can be displaced in the radial direction of the support plate 20, i.e., in the direction of movement of each holding member 10 by the moving unit 30. As a result, when the fluid is discharged from the nozzle 13a of the nozzle portion 13 of each holding member 10 in the plate-shaped workpiece transfer apparatus 102, the tilt of the rod portion 11 in its oscillating direction is adjusted so that the lower surface 11a of the rod portion 11 becomes parallel to the holding surface 110a of the chuck table 110 or 181 due to the Bernoulli effect by the fluid as depicted in FIG. 16.

In the plate-shaped workpiece transfer apparatus 1-2 and the cutting apparatus 100 according to the second preferred embodiment mentioned above, the nozzle 13a is formed so as to open to the lower surface 11a of the rod portion 11, and the engaging portion 12 for engaging the outer edge of the workpiece W is formed at the lower end of the rod portion 11. Further, each holding member 10 is vertically movably supported so as to project downward from the support plate 20. The fluid is discharged from the nozzle 13a to obtain an effect similar to the effect of the first preferred embodiment. That is, possible damage to the plate-shaped workpiece transfer apparatus 102 and the cutting apparatus 100 can be suppressed without the need for increasing the number of man-hours required for adjustment of the position of each part.

Further, in the plate-shaped workpiece transfer apparatus 1-2 and the cutting apparatus 100 according to the second preferred embodiment, the rod portion 11 of each holding member 10 is tiltably supported so as to project downward from the support plate 20. Accordingly, it is unnecessary to adjust the lower surface 11a of the rod portion 11 so that the lower surface 11a becomes parallel to the holding surface 110a. That is, the lower surface 11a automatically becomes parallel to the holding surface 110a due to the Bernoulli effect by the fluid discharged from the nozzle 13a. As a result, it is unnecessary to adjust the angle of each holding member 10 with respect to the holding surface 110a.

(Modifications)

Figure 17:
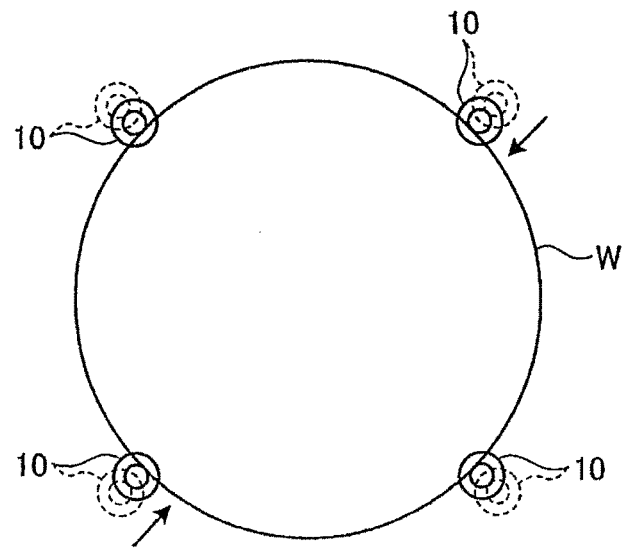
FIG. 17 is a plan view depicting four holding members included in a plate-shaped workpiece transfer apparatus according to a first modification.
Figure 18:
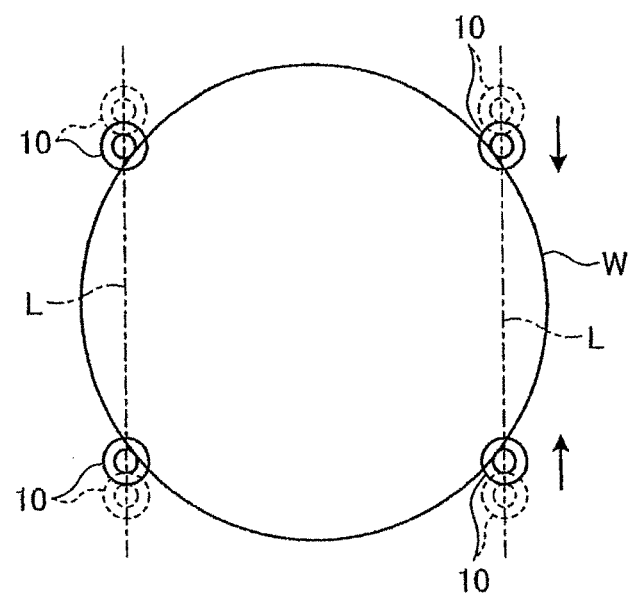
FIG. 18 is a plan view similar to FIG. 17, depicting the direction of movement of the holding members according to a second modification.

Various modifications of the first or second preferred embodiment mentioned above will now be described with reference to FIGS. 17 to 21. In FIGS. 17 to 21, the same parts as those of the first preferred embodiment are denoted by the same reference symbols, and the description thereof will be omitted. FIGS. 17 and 18 depict first and second modifications, respectively. In each of the first and second modifications, four holding members 10 are provided in the plate-shaped workpiece transfer apparatus 1 so as to be arranged at equal intervals in the circumferential direction of the support plate 20. The four holding members 10 depicted in FIG. 17 are movable in the radial direction of the support plate 20 as in the first preferred embodiment. On the other hand, the four holding members 10 depicted in FIG. 18 are movable along two parallel lines L (depicted by a phantom line in FIG. 18).

Figure 19:
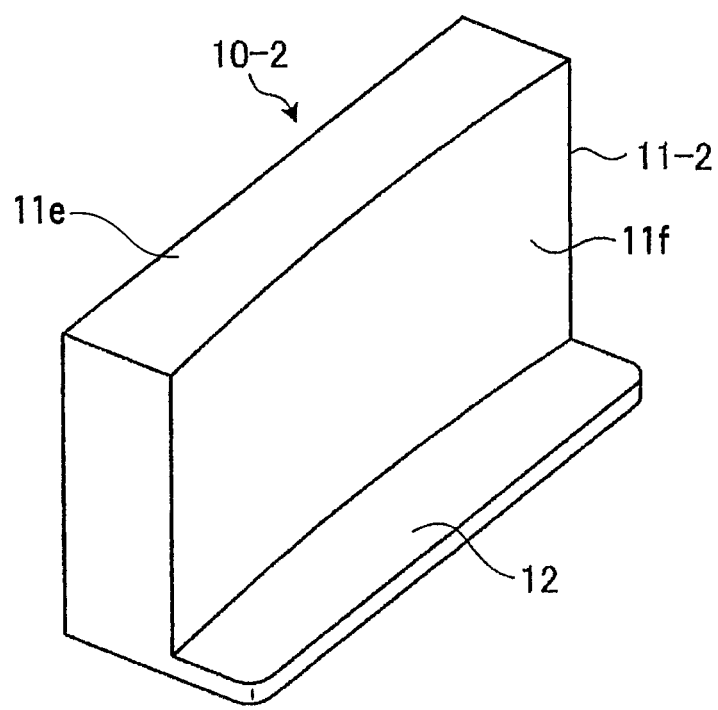
FIG. 19 is a perspective view of a holding member in a third modification.

FIG. 19 depicts a third modification, wherein two holding members 10-2 are provided in the plate-shaped workpiece transfer apparatus 1 so as to be arranged at equal intervals in the circumferential direction of the support plate 20. In FIG. 19, one of the two holding members 10-2 having the same configuration is depicted. The two holding members 10-2 are opposed to each other with the center of the support plate 20 interposed therebetween. Each holding member 10-2 has a substantially rectangular prismatic rod portion 11-2 such that it has a flat outer surface 11e and a slightly curved inner surface 11f. The flat outer surface 11e is parallel to a line tangent to the outer circumference of the workpiece W. The slightly curved inner surface 11f is opposed to the outer circumference of the workpiece W and has a curvature equal to that of the outer circumference of the workpiece W. An engaging portion 12 is formed at the lower end of the rod portion 11-2 so as to project from the whole length of the bottom of the inner surface 11f.

Figure 20:
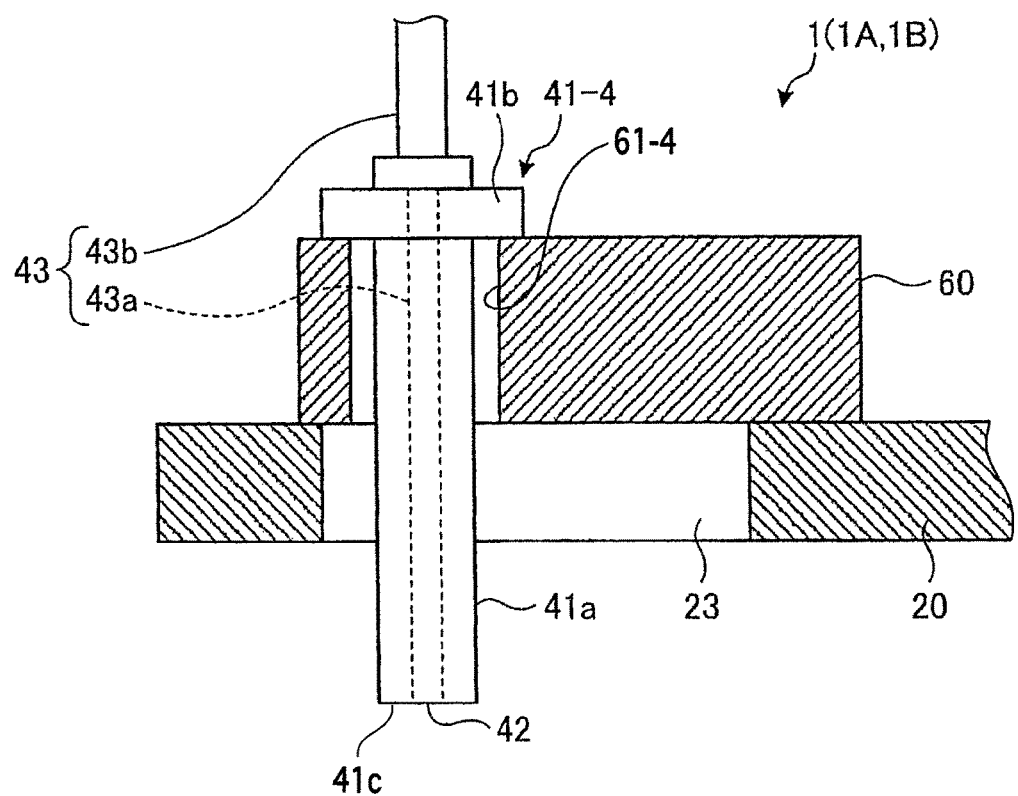
FIG. 20 is a sectional view depicting a restriction pin in a fourth modification.
Figure 21:
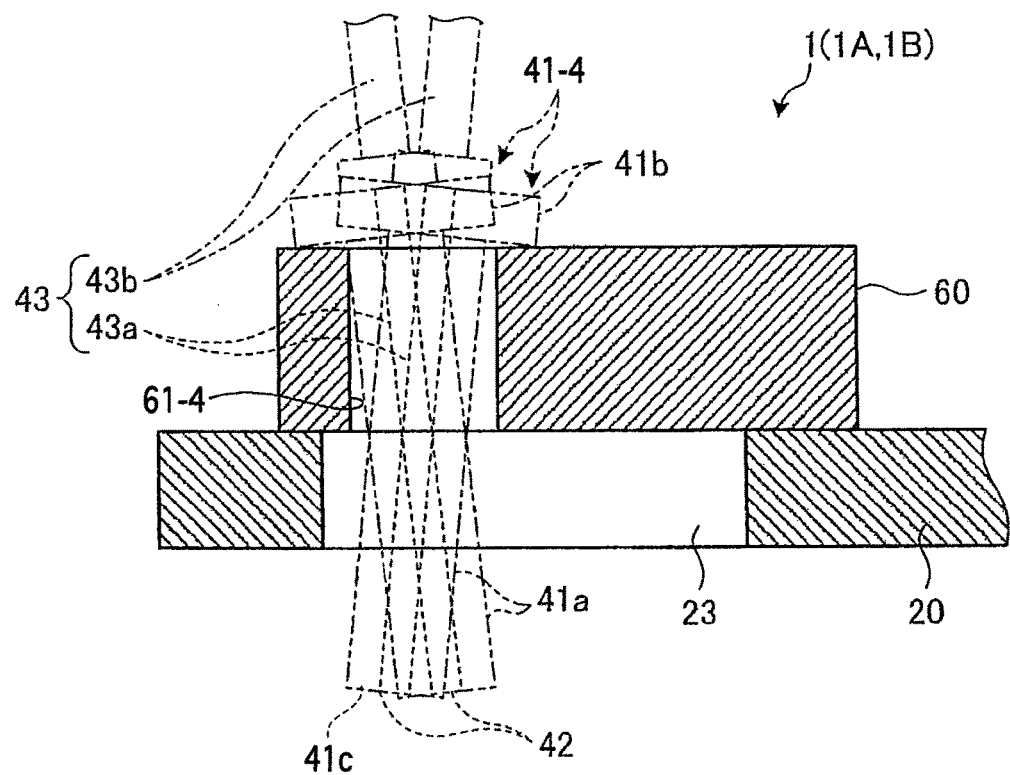
FIG. 21 is a view similar to FIG. 20, depicting a condition that the restriction pin is oscillated.

FIGS. 20 and 21 depict a fourth modification, wherein a restriction pin 41-4 is provided in place of each restriction pin 41 depicted in FIG. 8. As depicted in FIG. 20, an elongated hole 61-4 for insertion of the restriction pin 41-4 is formed through the support member 60. The elongated hole 61-4 is elongated in the radial direction of the support plate 20, i.e., in the direction of movement of each holding member 10 by the moving unit 30. The restriction pin 41-4 is tiltably supported so as to project downward from the support plate 20 as depicted by a broken line in FIG. 21 in such a manner that the lower end of the restriction pin 41-4 can be displaced in the radial direction of the support plate 20, i.e., in the direction of movement of each holding member 10 by the moving unit 30.

Further, as depicted in FIG. 20, the lower surface 41c of the restriction pin 41-4 is formed with a restriction pin nozzle 42 for discharging a fluid toward the holding surface 110a to thereby position the lower surface 41c in the vicinity of the holding surface 110a. The fluid to be discharged from the restriction pin nozzle 42 is air, for example. A fluid supply portion 43 is connected to the restriction pin nozzle 42 to supply the fluid from a fluid source (not depicted) to the restriction pin nozzle 42. The fluid supply portion 43 includes a supply passage 43a formed in the restriction pin 41-4 so as to be connected to the restriction pin nozzle 42 and a supply pipe 43b for connecting the supply passage 43a to the fluid source.

When each holding member 10 of the holding unit 2 approaches the frame portion 112 of the chuck table 110 or 181, each restriction pin 41-4 is prevented from coming into contact with the frame portion 112 of the chuck table 110 or 181 because the fluid is discharged from the restriction pin nozzle 42. Further, the fluid discharged from the restriction pin nozzle 42 is allowed to flow along the upper surface of the frame portion 112, thereby producing a Bernoulli effect. Due to this Bernoulli effect, the lower surface 41c of the restriction pin 41-4 is attracted to the frame portion 112 of the chuck table 110 or 181. As a result, the lower surface 41c of the restriction pin 41-4 is set at a level slightly higher than the holding surface 110a owing to the Bernoulli effect by the fluid. At the same time, the tilt of the restriction pin 41-4 in the oscillating direction thereof is adjusted so that the lower surface 41c of the restriction pin 41-4 becomes parallel to the holding surface 110a of the chuck table 110 or 181 owing to the Bernoulli effect by the fluid.

As another modification, each restriction pin 41 or 41-4 may be movable in the radial direction of the support plate 20 by any actuator including the air cylinder 33 as in the case of each holding member 10 or 10-2. In this modification, each restriction pin 41 or 41-4 may be retracted to a radially outer position on the support plate 20 at any time other than the time of transferring the workpiece W to the chuck table. Only when the workpiece W is transferred to the chuck table, each restriction pin 41 or 41-4 may be moved to a radially inner position on the support plate 20, i.e., an operative position where the horizontal displacement of the workpiece W is prevented by the restriction pin 41 or 41-4. Further, each restriction pin 41-4 may not be oscillatable.

In the plate-shaped workpiece transfer apparatus 1 and the cutting apparatus 100 according to the first to fourth modifications depicted in FIGS. 17 to 21, the nozzle 13a is formed so as to open to the lower surface 11a of the rod portion 11, and the engaging portion 12 for engaging the outer edge of the workpiece W is formed at the lower end of the rod portion 11. Further, each holding member 10 is vertically movably supported so as to project downward from the support plate 20. The fluid is discharged from the nozzle 13a to thereby suppress possible damage to the apparatus without the need for increasing the number of man-hours required for adjustment of the position of each part.

In the plate-shaped workpiece transfer apparatus 1 and the cutting apparatus 100 according to the fourth modification depicted in FIGS. 20 and 21, the fluid is discharged from the lower surface 41c of the restriction pin 41-4 adapted to be oscillated. Accordingly, as similar to each holding member 10 according to the second preferred embodiment, the lower surface 41c of the restriction pin 41-4 can be automatically set at a predetermined height from the holding surface 110a. Furthermore, the lower surface 41c can be kept parallel to the holding surface 110a. Thus, the lower surface 41c of the restriction pin 41-4 is automatically set at a level slightly higher than the holding surface 110a, thereby preventing possible collision of the restriction pin 41-4 with the holding surface 110a. Thus, the need for adjustment of the position of the plate-shaped workpiece transfer apparatus 1 can be eliminated.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A plate-shaped workpiece transfer apparatus for transferring a plate-shaped workpiece to/from a holding surface of a chuck table, said plate-shaped workpiece transfer apparatus comprising:

a holding unit for holding said plate-shaped workpiece; and a moving mechanism for moving said holding unit;

said holding unit including at least two holding members for holding the outer edge of said plate-shaped workpiece, a support plate for supporting said holding members so as to allow the movement of said holding members in a moving direction toward or away from the outer edge of said plate-shaped workpiece, and a moving unit for moving said holding members in said moving direction;

each of said holding members including a rod portion vertically movably extending downward through said support plate, an engaging portion formed on the outer circumference of said rod portion at the lower end thereof for engaging the outer edge of said plate-shaped workpiece, and a nozzle portion for discharging a fluid from the lower surface of said rod portion toward said holding surface to thereby float said plate-shaped workpiece from said holding surface.

2. The plate-shaped workpiece transfer apparatus according to claim 1, wherein said rod portion is loosely inserted through a hole formed in said support plate so as to be tiltable;

whereby when said fluid is discharged from said nozzle portion, the tilt of said rod portion is adjusted so that the lower surface of said rod portion becomes parallel to said holding surface.

3. The plate-shaped workpiece transfer apparatus according to claim 1, further comprising:

a plurality of restriction pins for restricting the movement of said plate-shaped workpiece in a direction parallel to said holding surface;

said restriction pins being vertically movably supported to said support plate so as to project downward from said support plate;

said restriction pins being arranged around said plate-shaped workpiece in the condition where said plate-shaped workpiece is held by said holding members;

the lower surface of each restriction pin being formed with a restriction pin nozzle for discharging a fluid toward said holding surface to thereby position the lower surface of each restriction pin in the vicinity of said holding surface.

* * * * *